United States Patent
Shao et al.

(10) Patent No.: US 11,564,328 B2
(45) Date of Patent: Jan. 24, 2023

(54) LOUVER DESIGN FOR BATTERY BACKUP UNITS

(71) Applicant: Baidu USA LLC, Sunnyvale, CA (US)

(72) Inventors: Shuai Shao, Milpitas, CA (US); Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 464 days.

(21) Appl. No.: 16/708,155

(22) Filed: Dec. 9, 2019

(65) Prior Publication Data

US 2021/0176889 A1      Jun. 10, 2021

(51) Int. Cl.
| | |
|---|---|
| *H05K 7/14* | (2006.01) |
| *H01M 10/613* | (2014.01) |
| *H01M 10/627* | (2014.01) |
| *H01M 10/63* | (2014.01) |
| *H01M 10/6566* | (2014.01) |
| *H01M 10/48* | (2006.01) |
| *H01M 10/42* | (2006.01) |
| *H05K 7/20* | (2006.01) |
| *H01M 10/6563* | (2014.01) |
| *H01M 50/20* | (2021.01) |
| *H01M 50/204* | (2021.01) |
| *H01M 50/251* | (2021.01) |

(52) U.S. Cl.
CPC ...... *H05K 7/1492* (2013.01); *H01M 10/4228* (2013.01); *H01M 10/486* (2013.01); *H01M 10/613* (2015.04); *H01M 10/627* (2015.04); *H01M 10/63* (2015.04); *H01M 10/6563* (2015.04); *H01M 10/6566* (2015.04); *H01M 50/20* (2021.01); *H01M 50/204* (2021.01); *H01M 50/251* (2021.01); *H05K 7/20181* (2013.01); *H05K 7/20272* (2013.01); *H05K 7/20736* (2013.01); *H05K 7/20818* (2013.01); *H05K 7/20836* (2013.01); *H01M 2220/10* (2013.01)

(58) Field of Classification Search
None
See application file for complete search history.

(56) References Cited

U.S. PATENT DOCUMENTS

| | | | |
|---|---|---|---|
| 2015/0211649 A1* | 7/2015 | King | E21B 44/00 |
| | | | 137/625.2 |
| 2019/0053400 A1* | 2/2019 | Hendrix | H05K 7/20136 |
| 2019/0234136 A1* | 8/2019 | Lu | E06B 7/10 |
| 2021/0066768 A1* | 3/2021 | Gao | H01M 10/63 |

* cited by examiner

*Primary Examiner* — Karie O'Neill Apicella
(74) *Attorney, Agent, or Firm* — Womble Bond Dickinson (US) LLP

(57) ABSTRACT

According to one embodiment, a battery backup unit (BBU) with a louver design includes a container, a battery module having one or more battery cells, a first louver at a frontend of the container, a second louver at a backend of the container, and a control mechanism that is coupled to both the first and second louvers and is configured to open and close the louvers. Also, the battery module and the control mechanism are disposed within the container. In another embodiment, a BBU shelf with a similar louver design that includes one or more battery modules may be implemented within an electronic rack.

20 Claims, 8 Drawing Sheets

LOUVER DESIGN FOR BATTERY BACKUP UNITS

FIELD

Embodiments of the present disclosure relate generally to a battery backup unit (BBU) with a louver design for electronic racks.

BACKGROUND

Lithium-ion batteries are commonly used in the vehicle industry, for example, electric vehicles (EVs) and plug-in hybrids. Lithium-ion battery packs for electric vehicles are designed for vehicle specific requirements and usage. Lithium-ion batteries, however, are also becoming more popular for Information Technology (IT) equipment stored and operated in data centers as an energy storage unit that is replacing Uninterruptible Power Supply (UPS) systems.

Large clusters of computer servers can be kept in dedicated facilities, often in a rack enclosure. The servers can be used in support of the data center industry. Use of a battery backup unit (BBU) in place of traditional solutions, such as lead-acid based UPS systems has grown in popularity. One result of the BBU's new role in the data center space is the relocation of the BBU from a centralized battery room to a data center IT room. The thermal environment (temperature) in the data center is generally managed and operated based on specifications and requirements of the servers, not batteries and therefore may not be optimized for BBU use.

Thermal management of (e.g., lithium-ion) batteries of a BBU in a data center application is a major concern. For example, if battery cell temperature exceeds a certain threshold (e.g., 70° C.) during operation (e.g., charging and/or discharging) there may be a thermal runaway, which may lead to battery failure. For instance, if the temperature exceeds the threshold, exothermic chemical reactions within the battery cell may escalate heat generation, further increasing the battery cell temperature, which may result in battery failure in a short time period. Several causes can lead to thermal runaway including hotspot thermal expansion in the battery cell, degradation, short circuit and individual discrepancies between battery cells. In addition, these causes may exist either when the batteries are charging/discharging or not. Due to the excessive heat, a battery failure may result in a fire. When the fire occurs at one or more batteries, a fire suppression function within the data center needs to be triggered to prevent the spread of fire to damage any surrounding BBUs and IT equipment. Therefore, a BBU design is needed that addresses the thermal runaway issue and is able to suppress a fire that occurs in one or more of the BBU's batteries in order to prevent any damage to surrounding BBUs and IT equipment.

BRIEF DESCRIPTION OF THE DRAWINGS

The aspects are illustrated by way of example and not by way of limitation in the figures of the accompanying drawings in which like references indicate similar elements. It should be noted that references to "an" or "one" aspect of this disclosure are not necessarily to the same aspect, and they mean at least one. Also, in the interest of conciseness and reducing the total number of figures, a given figure may be used to illustrate the features of more than one aspect, and not all elements in the figure may be required for a given aspect.

DETAILED DESCRIPTION

Figure 1:
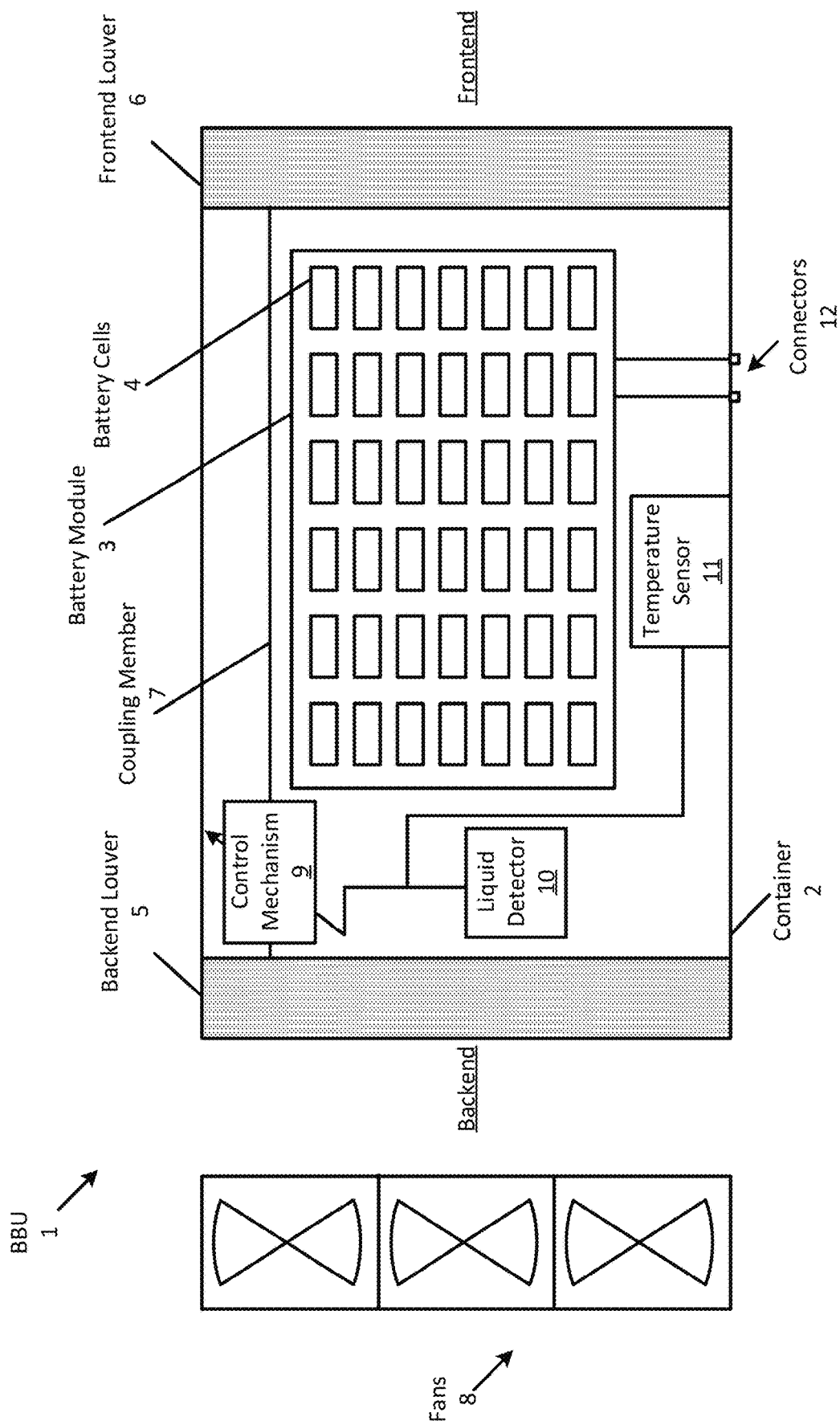
FIG. 1 is a block diagram illustrating an example of a battery backup unit (BBU) with a louver design according to one embodiment.

Several aspects of the disclosure with reference to the appended drawings are now explained. Whenever the shapes, relative positions and other aspects of the parts described in a given aspect are not explicitly defined, the scope of the disclosure here is not limited only to the parts shown, which are meant merely for the purpose of illustration. Also, while numerous details are set forth, it is understood that some aspects may be practiced without these details. In other instances, well-known circuits, structures, and techniques have not been shown in detail so as not to obscure the understanding of this description. Furthermore, unless the meaning is clearly to the contrary, all ranges set forth herein are deemed to be inclusive of each range's endpoints.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

The present disclosure solves the problem of thermal runaway of battery cells in a battery backup unit (BBU) employed in a data center. The solution proposed in the current disclosure provides a louver design in which louvers at either end may be positioned depending upon certain criteria. Specifically, the present disclosure describes a BBU with a frontend louver and a backend louver. During operation (e.g., charging and/or discharging) and/or while not in operation, the louvers may be in an open position in order to allow the batteries contained therein to be forced air-cooled. In response to a battery failure, however, the louvers may be closed (e.g., controlled to a closed positioned) in order to encapsulate the battery cells (e.g., fully enclose the battery cells within the BBU) from the ambient environment. For instance, in case of high battery cell temperature and/or the presence of liquid, the louvers may be closed to prevent a fire and liquid from spreading out from the BBU.

According to one embodiment, a BBU includes a container, a battery module having one or more battery cells configured to provide battery energy to a load and are configured to draw power from an external power supply to charge the battery cells, a first louver at a front end of the container, a second louver at a backend of the container, and a control mechanism that is coupled to both the first and second louvers and is configured to open and close the louvers. Also, the battery module and the control mechanism are disposed within the container.

In one embodiment, the BBU further includes a temperature sensor that is communicatively coupled to the control mechanism and is configured to sense an internal temperature of the BBU. The control mechanism is configured to close the louvers in response to the internal temperature exceeding a threshold temperature. In another embodiment, the BBU further includes a liquid detector that is configured to detect a presence of liquid in the container. The control mechanism is configured to close the louvers in response to the liquid detector detecting the presence of liquid.

In one embodiment, each of the louvers includes one or more blades that are configured to rotate between different positions in response to the control mechanism opening and closing the louvers. In another embodiment, for each of the louvers and while in a closed position, an edge of each blade of the louver abuts a different blade of the louver. The edge of at least some of the blades are covered by a sealing material that is configured to form a seal between the edge and the different blade while abutting the different blade. In some embodiments, the sealing material is composed of at least one of a rubber material and a plastic.

In one embodiment, the BBU further includes one or more fans that are coupled to the container and configured to push air through the container or draw air into the container while the first and second louvers are open. In other embodiments, the BBU also includes a third louver that is disposed within the container and between the first and second louvers. In this case, the control mechanism is coupled to the third louver and is configured to open and close the third louver with the first and second louvers.

In one embodiment, the control mechanism is one of an actuator and a motor. In some embodiments, the actuator is a fail-closed actuator that is configured to close the louvers in response to a failure of the actuator.

According to one embodiment, an electronic rack includes several pieces of Information Technology (IT) equipment, at least one of the pieces of IT equipment including one or more servers to provide data processing services, a power supply unit coupled to the pieces of IT equipment, and a BBU shelf to provide backup power to the pieces of IT equipment when the power supply is unavailable. The BBU shelf including a container, one or more battery modules, a first louver, a second louver, and a control mechanism as previously described.

It should be mentioned that the phrase "battery pack" may be used herein interchangeably with "BBU module" and with "BBU pack". Also, a BBU may include one or more battery modules (or battery packs). A battery module may include one or more battery cells. Other features are also described in the following examples.

FIG. 1 is a block diagram illustrating an example of a BBU with a louver design according to one embodiment. Specifically, this figure shows a (e.g., top-down view of a) BBU 1 with a container 2 and one or more fans 8. The container 2 includes a frontend (e.g., a first) louver 6, a backend (e.g., a second) louver 5, a battery module 3 that includes one or more battery cells 4, a control mechanism 9, a liquid detector 10, and a temperature sensor 11. In one embodiment, the BBU 1 may include more or less elements as described herein. For example, the BBU may include more louvers at either end of the BBU. As another example, the BBU may not include the liquid detector or the temperature sensor.

As illustrated, the container 2 is a rectangular box with a louver (or louver damper) at either end. In one embodiment, the container may have any shape, such as being cube-shaped or cylindrically-shaped. In one embodiment, the container may be composed of any type of material, such as a metal (e.g., iron) or an alloy (e.g., steel). In another embodiment, the container may be composed of a composite material. For example, the container may include at least two layers: an inside layer that is composed of a fire-retardant material (e.g., cement, fiberglass, etc.) and an outside layer that is composed of a metal.

The frontend louver 6 and backend louver 5 are configured to open (or at least partially open) in order to enable the (inside of the) container to fluidly couple to the ambient environment. Specifically, while in an open position (e.g., or not in a fully closed position), each of the louvers allows air to flow from outside the environment, through the louver and into the container, or allows air to flow from the inside of the container (which may have entered the container through an opposite end louver), through the louver, and out into the environment. When the louvers are in a closed position, the container is at least partially sealed from the outside environment. In one embodiment, louvers create an airtight seal that does not allow air to flow into or out of the container when the louvers are in a closed position. In another embodiment, the louvers create a watertight seal that does not allow fluid to enter or exit the container when in the closed position. In one embodiment, the louvers may be individually controlled such that they may transition between an open position, an at least partially open position, and/or a closed position. More about controlling the louvers is described herein.

In one embodiment, the BBU 1 may have any configuration of louvers in order to allow air to flow into and out of the BBU. Specifically, rather than having only two louvers, the container may have three or more louvers. For example, along with the backend louver 5 and the frontend louver 6, the container may have two louvers on opposite longitudinal sides of the container in order to allow two different airflows (e.g., when all louvers are open air flows from front to back and air flows from one side to another side). As another example, the BBU may include at least three louvers, where a third louver is disposed within the container and between the backend louver 5 and the frontend louver 6. Specifically, the third louver may be disposed next to the backend louver in order to ensure a better seal when both louvers are closed. As a result, the third louver may be configured to open and close with the other two louvers. More about controlling the louvers is described herein.

The battery module 3 may have any shape and configuration. For example, as illustrated, the battery module is a rectangular box. In another embodiment, however, the battery module may be cubic-shaped or cylindrically shaped. In one embodiment, the battery module may have a similar shape as the container. In some embodiments, the battery module may include one battery cell 4, or may include two or more battery cells that are series connected, parallel connected, or a combination thereof. The battery cells may be of any type, such as Lithium-ion as described herein. As illustrated, the battery module is electrically coupled to a pair of connectors 12 that are configured to electrically couple the (module of the) BBU to a load to provide battery energy stored within the cells and a power supply (or source) to charge the battery cells. In one embodiment, the pair of connectors are configured to removably couple to the load or power supply. For instance, the connectors may be any type of connectors, such as quick-connect fittings that allow for easy connection/removal of the BBU to the load or power supply. In one embodiment, the battery module may be removably coupled to the pair of connectors 12 (from the inside of the container), and may be removed from the BBU. For instance, the container may include an opening (or a hatch) through which the battery module may be removed (or added). In one embodiment, at least one of the louvers may be removably coupled to the container in order for a user to gain access to the inside of the container.

As illustrated, the liquid detector 10 and the temperature sensor 11 are both disposed within the container 2 and are communicatively coupled (via a wired and/or wireless connection) to the control mechanism 9. The liquid detector is configured to detect a presence of liquid inside the container 2, and in response generate and transmit an electric signal that represents a detection of the liquid to the control mechanism. For example, the detector may be a porous structure that is coupled between an anode and a cathode. Once a conductive liquid such as battery electrolyte (e.g., $LiPF_6$ solution) is nearby, the solution is absorbed by the porous structure and current may pass from the anode, through the porous structure, to the cathode, which may cause the generation of the electric signal. In one embodiment, the liquid detector may be any type of liquid detector that is configured to detect the presence of any type of liquid (e.g., conductive and nonconductive).

The temperature sensor 11 is configured to sense an internal temperature of the BBU, and in response generate and transmit an electric signal that represents the internal temperature to the control mechanism. The temperature sensor may be any type of sensor that is configured to sense temperature, such as a thermocouple, a Resistance Temperature Detector (RTD), etc. In one embodiment, the temperature sensor may be positioned anywhere inside the container to sense the temperature. For instance, as illustrated the temperature sensor is to the side of the battery module. The sensor, however, may be positioned next to, placed on, or within the battery module. In one embodiment, the BBU may include multiple temperature sensors. For instance, since some of the battery cells may fail while others do not, hotspots may form on the battery module. In order to account for this, several temperature sensors may be positioned on different locations about the battery module. In one embodiment, the temperature sensor may be positioned outside the battery module (e.g., on an outside surface of the container 2).

The control mechanism 9 is configured to receive signals from the liquid detector 10 and/or the temperature sensor 11 and is configured to open and close at least one of the louvers (e.g., the backend louver 5 and the frontend louver 6). For instance, the control mechanism may include a controller that is configured to use the received signals to determine whether the louvers are to be in an opened (or at least partially opened) position or a closed position. In one embodiment, the controller may be a special-purpose processor such as an application-specific integrated circuit (ASIC), a general purpose microprocessor, a field-programmable gate array (FPGA), a digital signal controller, or a set of hardware logic structures (e.g., filters, arithmetic logic units, and dedicated state machines). In one embodiment, the controller may be a circuit with a combination of analog elements (e.g., resistors, capacitors, inductors, etc.) and/or digital elements (e.g., logic-based elements, such as transistors, etc.). The control mechanism (and/or the controller) may also include memory.

The control mechanism 9 is configured to close the louvers in response to certain criteria. Specifically, the (e.g., controller of the) control mechanism is configured to determine what position the louvers should be in based on at least one of an internal temperature and/or whether there is a presence of liquid in the BBU. For example, the control mechanism is configured to close the louvers in response to the internal temperature exceeding a threshold temperature (e.g., 70° C.). As another example, the control mechanism is configured to close the louvers in response to the liquid detector detecting the presence of (e.g., conductive) liquid. In one embodiment, absent the presence of liquid and absent the internal temperature exceeding the threshold, the control mechanism is configured to open at least some of the louvers. In another embodiment, the control mechanism is configured to open the louvers (as long as the criteria is met), while the BBU is in operation. Otherwise, the control mechanism may close the louvers while the BBU is not in operation.

In one embodiment, the control mechanism 9 may be any mechanical component that is able to open/close louvers, such as an actuator or a motor. In another embodiment, the control mechanism is coupled to the frontend louver 6 and the backend louver 5 via a coupling member 7 and may control the position of the louvers by actuating or adjusting the coupling member 7. For example, the coupling member may be a rod that the control mechanism rotates, which in turn causes the louvers to open (or at least partially open) and close based on the degree of rotation by the coupling member. As another example, the coupling member may be a belt that the control mechanism pulls/pushes in order to control the louvers. By coupling the control mechanism to each of the louvers with a same coupling member, the louvers may be control simultaneously. In one embodiment, the control mechanism may couple to at least some of the louvers with a different coupling member. In this case, the control mechanism may individually control the position of the louvers by adjusting different coupling members that are coupled to the louvers. More about controlling the louvers is described herein.

In one embodiment, the control mechanism 9 may be a fail-close actuator that is configured to close the louvers in response to a failure of the actuator. For instance, in case of certain scenarios, such as loss of power or signal interruption with the liquid detector 10 and/or temperature sensor 11, the actuator will cause the louvers to close. In one embodiment, the actuator may include at least one spring that puts the actuator under spring pressure. During normal operation, the actuator controls the louvers under this spring pressure (e.g., pushing against the spring). When a failure occurs, the spring pressure overcomes the actuator, causing the louvers to close (e.g., by rotating the coupling member).

The fans 8 include one or more fans and are configured to push (or force) air into the BBU, via the backend louver 5, and/or are configured to pull (or draw) air through the BBU that enters through the frontend louver 6. In one embodiment, the fans 8 may be removably coupled to the (container 2 of the) BBU 1 or may be separate. In another embodiment, the fans may be communicatively coupled (e.g., via a wireless connection) to the control mechanism. For instance, the control mechanism may control the fans based on whether the louvers are open (or at least partially opened) or closed. For example, when the louvers are open, the control mechanism may send a control signal to the fans, causing the fans to activate. If, however, the louvers are closed, the fans may be deactivated. In one embodiment, the speed of the fans may be adjusted as well. For instance, the control mechanism may monitor the internal temperature of the BBU (via the temperature sensor 11). As the temperature rises, the control mechanism may cause the fans to increase fan speed in order to increase airflow through the container, which in turn may reduce the internal temperature.

Figure 2:
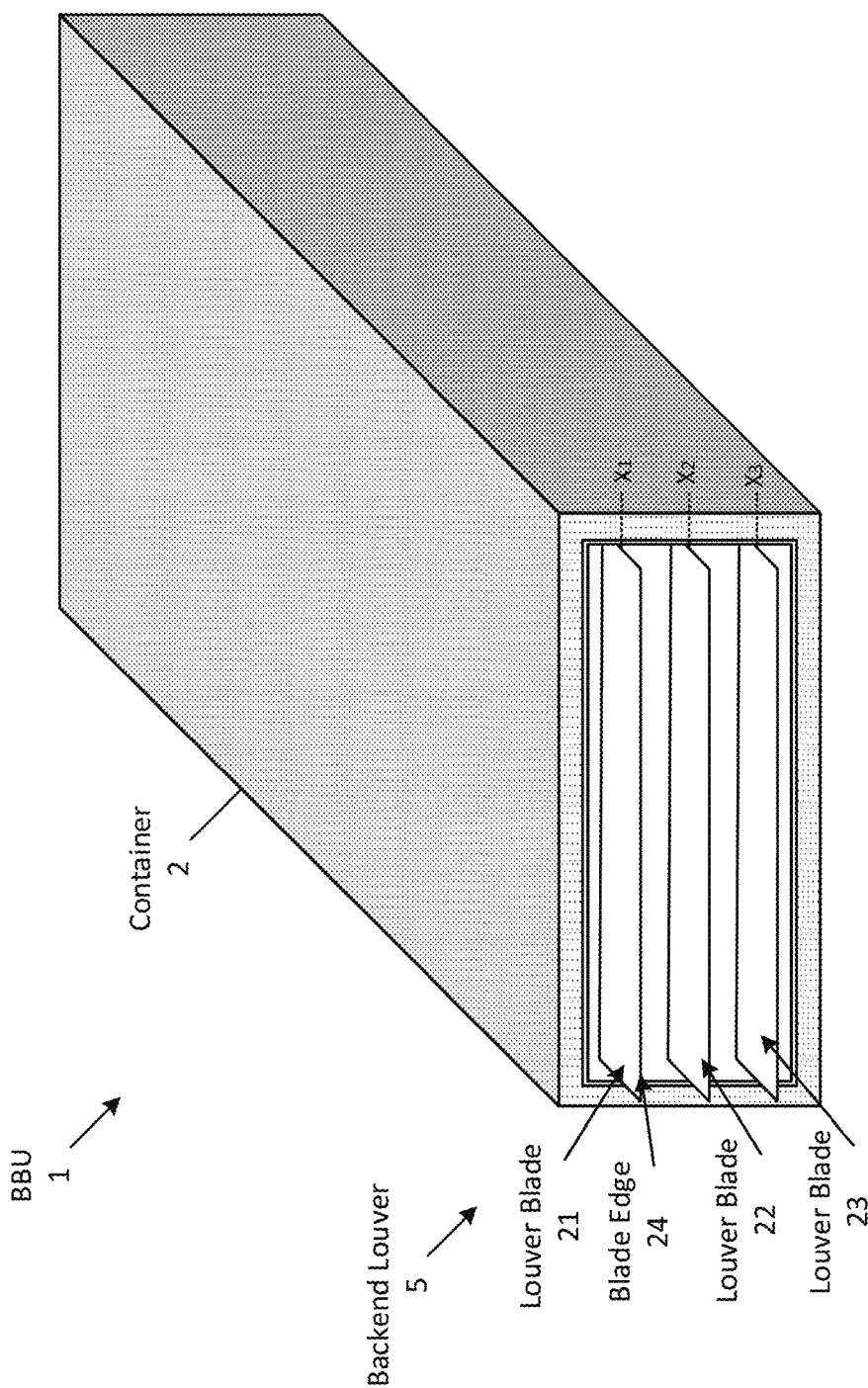
FIG. 2 is a perspective view of a BBU with louvers according to one embodiment.

FIG. 2 is a perspective view of BBU 1 according to one embodiment. This figure illustrates the backend louver 5 that is at least partially open. Specifically, the backend louver includes three louver blades 21-23 that are each configured to rotate about a separate horizontal axis (e.g., louver blade 21 rotates about $X_1$-axis) with respect to the container 2. When in an open position, each of the louver's blades are substantially horizontal with respect to one another in order to allow air to flow into (or out of) the container 2. In contrast, when the louver is in a closed position, each of the blades are substantially vertical with respect to one another (e.g., rotated about 90°) and an edge of each blade of the louver abuts a different blade of the louver. In particular, a blade edge 24 of the top blade 21 abuts the middle blade 22 when the louver is closed. For instance, the edge of the top blade may abut (or come into contact) with a surface of the middle blade. In one embodiment, in addition a portion of a surface of the top blade (e.g., a proximal surface with respect to the BBU when the louver is closed) may abut a portion of a surface of the middle blade (e.g., a distal surface with respect to the BBU when the louver is closed). This results in the container being sealed from the ambient environment.

Although illustrated as including three blades, the louver may include one or more louver blades. In one embodiment, both the backend louver 5 and the frontend louver 6 may include the same number of louver blades or a different number.

In one embodiment, the control mechanism 9 is configured to control the louvers by causing the louver blades to each rotate about a respective axis. For instance, each of the louver blades may be coupled to the coupling member 7. To cause the blades to rotate, the control mechanism 9 may actuate or adjust (e.g., rotate) the coupling member 7, which in turn causes the blades to rotate about their respective axes. In one embodiment, the control mechanism 9 may separately control at least some of the louver blades. For instance, each of the blades 21-23 may be rotated in different positions in order to adjust the airflow through the BBU 1.

Figure 3:
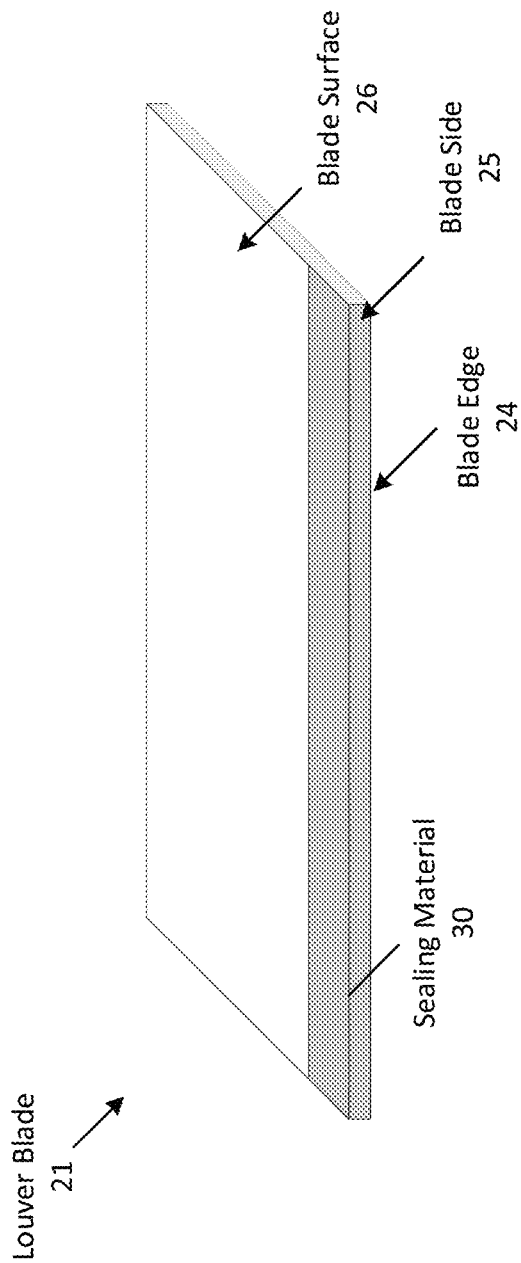
FIG. 3 shows a louver blade of a BBU according to one embodiment.

FIG. 3 shows a louver blade of a BBU according to one embodiment. Specifically, this figure illustrates a sealing material 30 that at least partially covers the louver blade 21. In particular, the sealing material is covering blade edge 24, a side of the blade 25 and a portion of a surface of the blade 26. In one embodiment, the sealing material may cover one or more of the edges, sides, and/or surfaces of the louver blade 21. The sealing material is configured to form a seal between the louver blade 21 and a different blade (e.g., blade 22) while the louver blade 21 is abutting (e.g., a surface of) the different blade (e.g., while the louver is in a closed position). For instance, the seal may be formed when any part of the louver blade 21 that includes the sealing material comes into contact with the different blade, such as the blade edge 24, the blade side 25, and the portion of the blade surface 26 that includes the sealing material as illustrated herein. In one embodiment, to form the seal the sealing material may be a pliable or flexible material that slightly deforms when the edge 24 that includes the sealing material abuts (the surface of) blade 22. This deformity may cause an airtight (and/or watertight) seal, while the louver is in a closed position. As described herein, the sealing may occur when other portions of the louver blade 21 abut a different blade. In one embodiment, the sealing material may be composed of any material, such as a rubber material or a plastic. In another embodiment, the sealing material is a material that is more pliable or flexible than a material from which the blade is composed.

Figure 4:
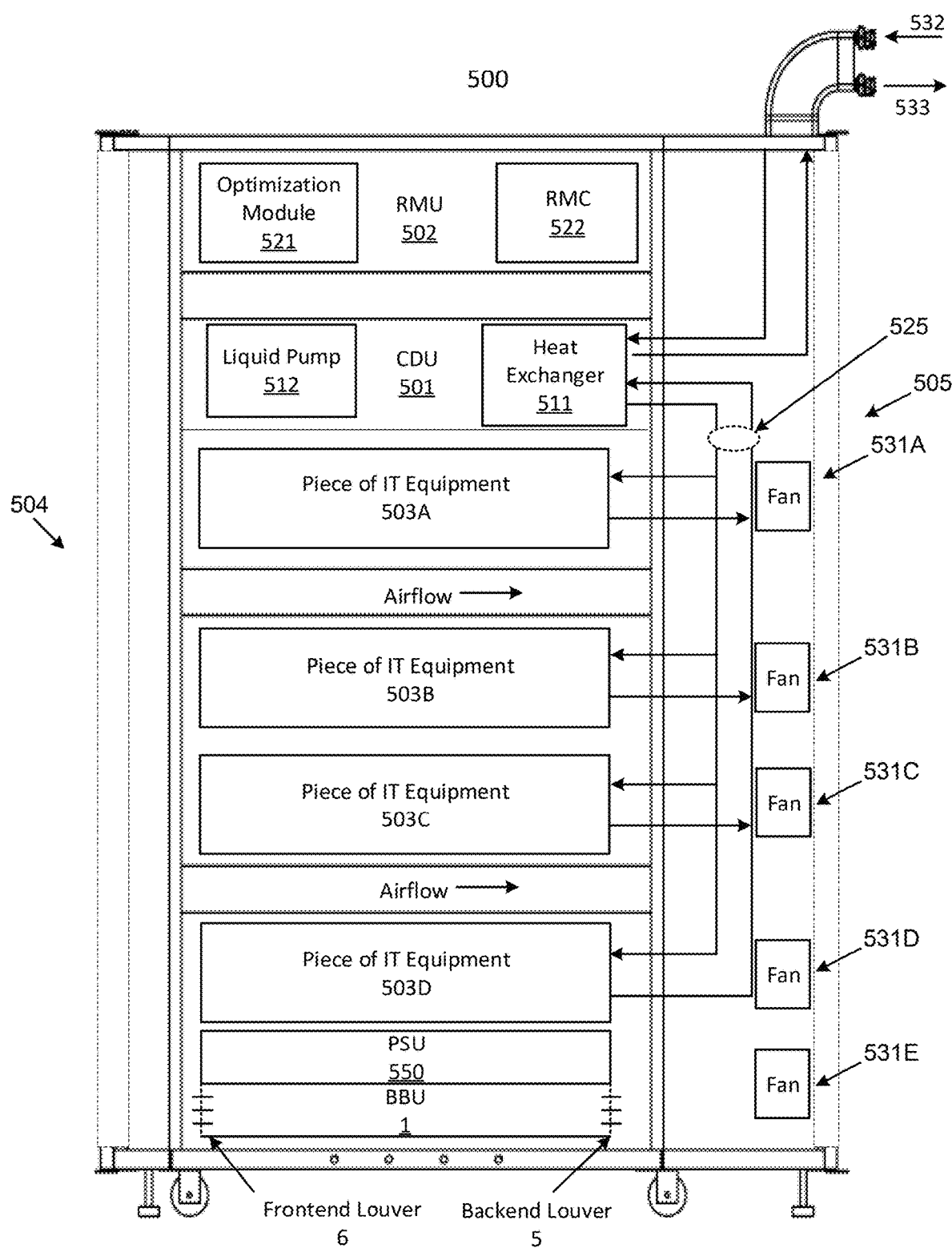
FIG. 4 is an example of an electronic rack with a BBU according to one embodiment.

FIG. 4 is a block diagram illustrating an example of an electronic rack with BBU 1 according to one embodiment. Electronic rack 500 may include one or more server slots to contain one or more servers respectively. Each server includes one or more information technology (IT) components (e.g., processors, memory, storage devices, network interfaces). According to one embodiment, electronic rack 500 includes, but is not limited to, CDU 501, rack management unit (RMU) 502 (optional), a power supply unit (PSU) 550, the BBU 1, and one or more pieces of IT equipment (or IT equipment) 503A-503D, which may be any type of IT equipment, such as server blades. The IT equipment 503 can be inserted into an array of server slots respectively from frontend 504 or backend 505 of electronic rack 500. The PSU 550 and/or BBU 1 may be inserted into any of server slots within the electronic rack 500. In one embodiment, one or more BBUs may be inserted into any of server slots within the electronic rack 500. As illustrated, the BBU 1 is inserted into the most bottom server slot (below the PSU 550) and has the frontend louver 6 and the backend louver 5 open. In one embodiment, the BBU 1 is located in this slot to prevent any liquid that may leak out of the BBU from contaminating any of the other components (e.g., the PSU 550 and/or any of the pieces of IT equipment).

Note that although there are only four pieces of IT equipment 503A-503D shown here, more or fewer pieces of IT equipment may be maintained within electronic rack 500. Also note that the particular positions of CDU 501, RMU 502, PSU 550, BBU 1, and IT equipment 503 are shown for the purpose of illustration only; other arrangements or configurations of these components. may also be implemented. Note that electronic rack 500 can be either open to the environment or partially contained by a rack container, as long as the cooling fans can generate airflows from the frontend to the backend (or generate airflows from the backend to the frontend).

In addition, a fan module can be associated with each of the pieces of IT equipment 503, and the BBU 1. In this embodiment, fan modules 531A-531E, collectively referred to as fan modules 531, and are associated with the pieces of IT equipment 503A-503D and BBU 1, respectively. Each of the fan modules 531 includes one or more cooling fans. For instance, fan module 531E may include the fans 8 as illustrated in FIG. 1. Fan modules 531 may be mounted on the backends of IT equipment 503 and/or BBU 1 to generate airflows flowing from frontend 504, traveling through the rack 500, and existing at backend 505 of electronic rack 900. In another embodiment, one or more of the fan modules may be positioned on the frontend 504 of the rack 500. Such frontend fans may be configured to push air into the pieces of IT equipment 503 and/or the BBU 1.

In one embodiment, CDU 501 mainly includes heat exchanger 511, liquid pump 512, and a pump controller (not shown), and some other components such as a liquid reservoir, a power supply, monitoring sensors and so on. Heat exchanger 511 may be a liquid-to-liquid heat exchanger. Heat exchanger 511 includes a first loop with inlet and outlet ports having a first pair of liquid connectors coupled to external liquid supply/return lines 532-533 to form a primary loop. The connectors coupled to the external liquid supply/return lines 532-533 may be disposed or mounted on backend 505 of electronic rack 500. The liquid supply/return lines 532-533 are coupled to a set of room manifolds, which are coupled to an external heat removal system, or extremal cooling loop. In addition, heat exchanger 511 further includes a second loop with two ports having a second pair of liquid connectors coupled to liquid manifold 525 to form a secondary loop, which may include a supply manifold to supply cooling liquid to the pieces of IT equipment 503 and a return manifold to return warmer liquid back to CDU 501. Note that CDUs 501 can be any kind of CDUs commercially available or customized ones. Thus, the details of CDUs 501 will not be described herein.

Each of the pieces of IT equipment 503 may include one or more IT components (e.g., central processing units or CPUs, graphical processing units (GPUs), memory, and/or storage devices). Each IT component may perform data processing tasks, where the IT component may include software installed in a storage device, loaded into the memory, and executed by one or more processors to perform the data processing tasks. At least some of these IT components may be attached to the bottom of any of the cooling devices as described above. IT equipment 503 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. The performance compute servers perform the actual tasks, which may generate heat during the operations.

In one embodiment, the BBU 1 is configured to provide backup power (e.g., drawing battery energy from one or more battery modules contained therein) to the rack (e.g., one or more pieces of IT equipment 503) when the rack is not drawing power from a main power source, such as during a black out. In one embodiment, operations performed by the control mechanism 9 of the BBU 1 may be performed by any of the components (e.g., IT equipment 503A) within the rack 500. For example, the IT equipment 503A may include a controller that is communicatively coupled with the liquid detector 10 and/or temperature sensor 11 and the control mechanism 9. The controller may obtain signals from the detector and sensor and determine whether the control mechanism should open or close the louvers of the BBU 1. Once determined, the controller may transmit a control signal to the control mechanism, which then causes the louvers to open or close. In one embodiment, the electronic rack 500 may include a BBU shelf that includes one or more battery modules rather than (or in addition to) the BBU 1. More about the BBU shelf is described herein.

Electronic rack 500 further includes optional RMU 502 configured to provide and manage power supplied to servers 503, fan modules 531, and CDU 501. Optimization module 521 and RMC 522 can communicate with a controller in some of the applications. RMU 502 may be coupled to PSU 550 to manage the power consumption of the PSU. The PSU 550 may include the necessary circuitry (e.g., an alternating current (AC) to direct current (DC) or DC to DC power converter, backup battery, transformer, or regulator, etc.) to provide power to the rest of the components of electronic rack 500.

In one embodiment, RMU 502 includes optimization module 521 and rack management controller (RMC) 522. RMC 522 may include a monitor to monitor operating status of various components within electronic rack 500, such as, for example, the pieces of IT equipment 503, CDU 501, and fan modules 531. Specifically, the monitor receives operating data from various sensors representing the operating environments of electronic rack 500. For example, the monitor may receive operating data representing temperatures of the processors, cooling liquid, and airflows, which may be captured and collected via various temperature sensors. The monitor may also receive data representing the fan power and pump power generated by the fan modules 531 and liquid pump 512, which may be proportional to their respective speeds. These operating data are referred to as real-time operating data. Note that the monitor may be implemented as a separate module within RMU 502.

Based on the operating data, optimization module 521 performs an optimization using a predetermined optimization function or optimization model to derive a set of optimal fan speeds for fan modules 531 and an optimal pump speed for liquid pump 512, such that the total power consumption of liquid pump 512 and fan modules 531 reaches minimum, while the operating data associated with liquid pump 512 and cooling fans of fan modules 531 are within their respective designed specifications. Once the optimal pump speed and optimal fan speeds have been determined, RMC 522 configures liquid pump 512 and cooling fans of fan modules 531 based on the optimal pump speed and fan speeds.

As an example, based on the optimal pump speed, RMC 522 communicates with a pump controller of CDU 501 to control the speed of liquid pump 512, which in turn controls a liquid flow rate of cooling liquid supplied to the liquid manifold 525 to be distributed to at least some of server blades 503. Therefore, the operating condition and the corresponding cooling device performance are adjusted. Similarly, based on the optimal fan speeds, RMC 522 communicates with each of the fan modules 531 to control the speed of each cooling fan of the fan modules 531, which in turn control the airflow rates of the fan modules 531. Note that each of fan modules 531 may be individually controlled with its specific optimal fan speed, and different fan modules and/or different cooling fans within the same fan module may have different optimal fan speeds.

Note that some or all of the IT equipment 503 (e.g., 503A, 503B, 503C, and/or 503D) may utilize different cooling methods. For instance, one server may utilize air cooling while another server may utilize liquid cooling. Alternatively, one IT component of a server may utilize air cooling while another IT component of the same server may utilize liquid cooling.

Figure 5:
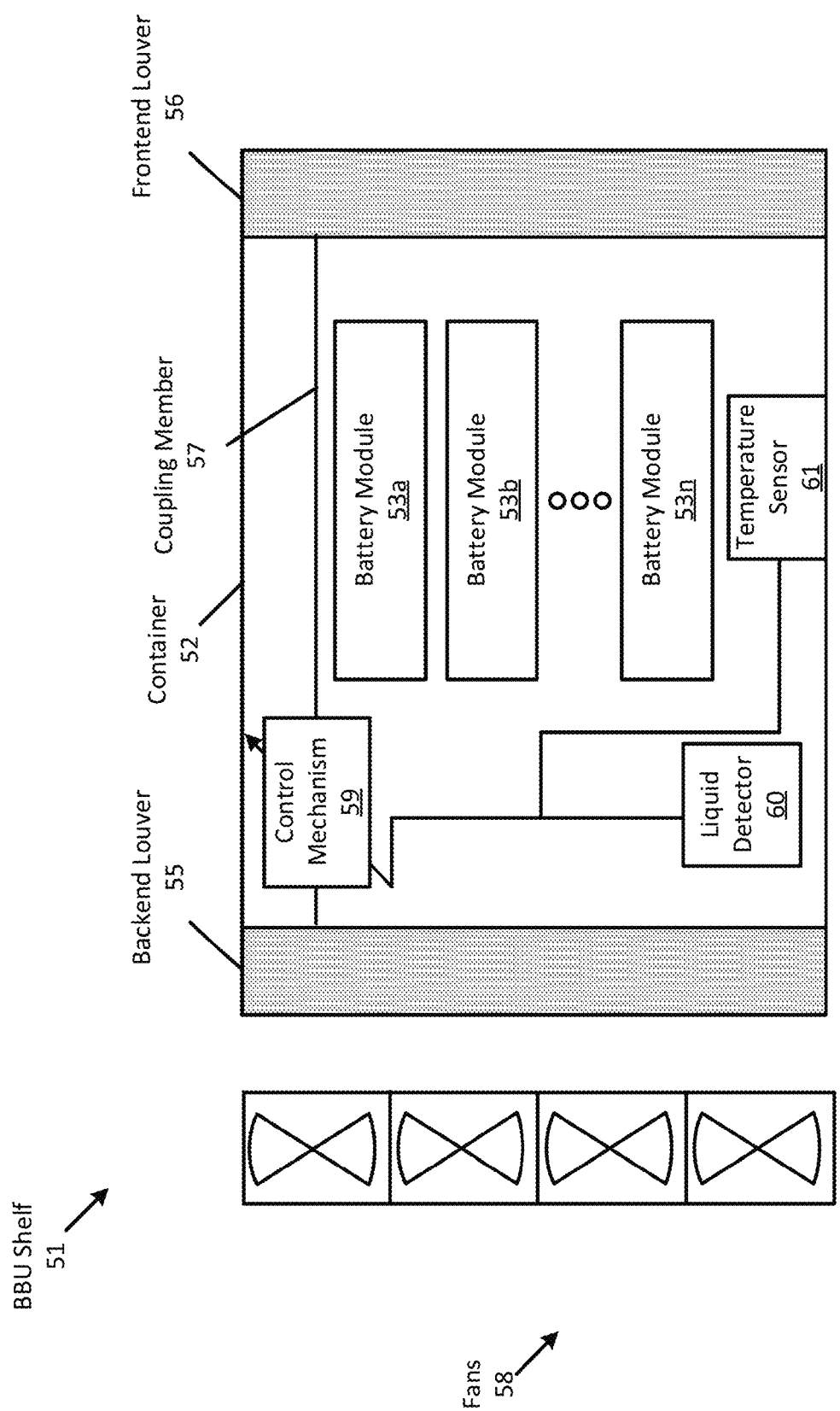
FIG. 5 illustrates a BBU shelf with louvers according to one embodiment.

FIG. 5 illustrates a BBU shelf with louvers according to one embodiment. This figure illustrates a BBU shelf 51 with a similar louver design as the BBU 1 of FIG. 1. For instance, the BBU shelf 51 includes a container 52 with a backend louver 55 and a frontend louver 56, a liquid detector 60, a temperature sensor 61, and a control mechanism 59 that is coupled to both louvers via a coupling member 57. In one embodiment, each of these components may be the same (or perform similar operations) as the components described in FIG. 1. In contrast to BBU 1, however, the BBU shelf includes one or more battery modules 53a-53n, which may be added to and removed from the BBU shelf 51 as needed. In one embodiment, each of the battery modules may couple to a separate pair of connectors (not shown), which may removably couple to a load (e.g., a piece of IT equipment).

In another embodiment, at least some of the battery modules may be coupled together (e.g., series connected, parallel connected, or a combination thereof) to provide more power to a load.

Also illustrated in this figure are one or more fans 58, which may push air into the backend louver 55, or may draw air through the BBU shelf and out the backend louver 55, as described herein. In one embodiment, the fans may be a part of the BBU shelf. In another embodiment, the fans may be a part of an electronic rack, as described herein.

As described herein, the BBU shelf 51 may perform similar operations as the BBU 1. Specifically, the control mechanism 59 may obtain signals from the liquid detector 60 and/or the temperature sensor 61, and determine whether to open or close at least one of the louvers.

Figure 6:
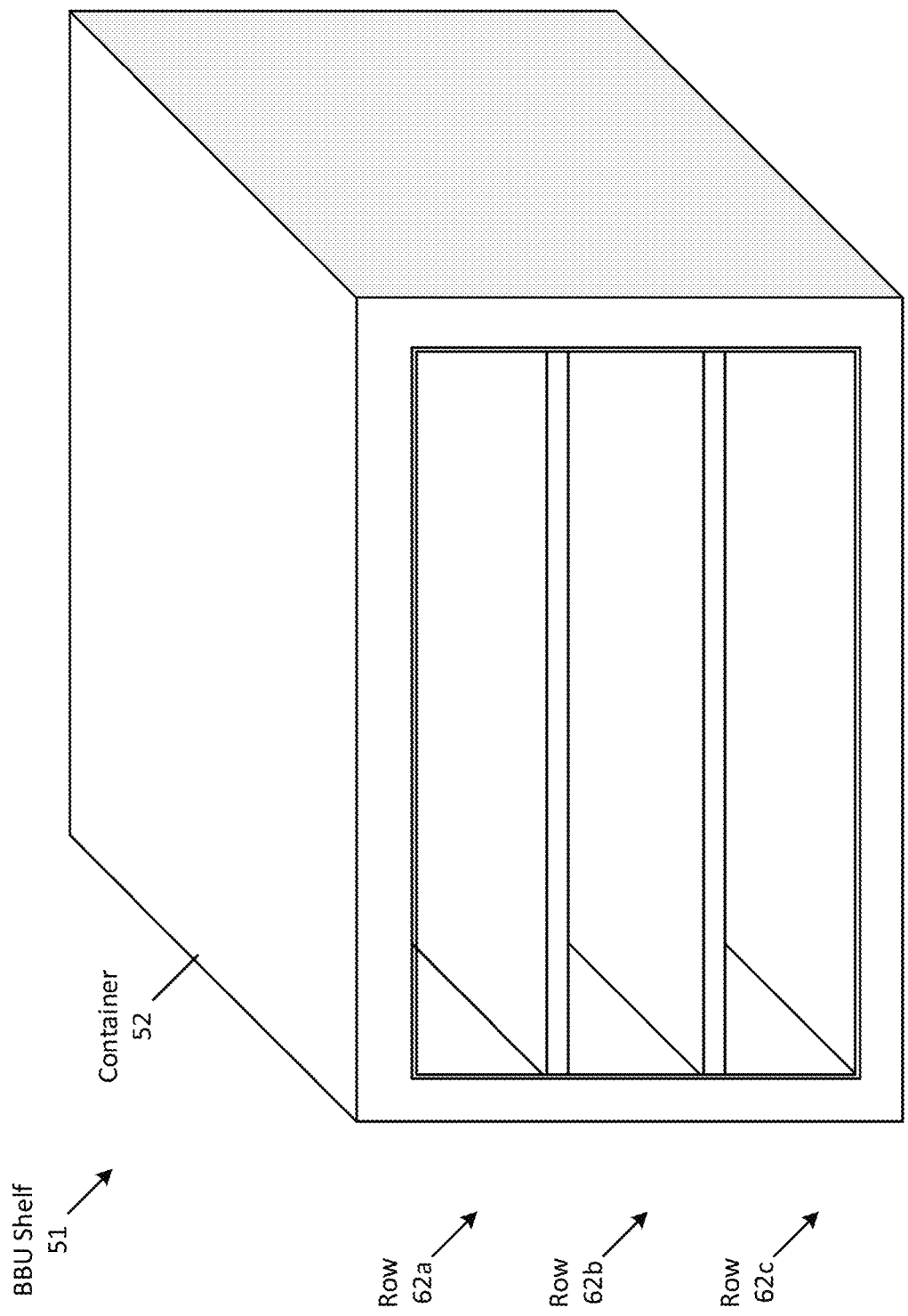
FIG. 6 illustrates an empty BBU shelf according to one embodiment.

FIG. 6 illustrates an empty BBU shelf according to one embodiment. Specifically, the container 52 includes three rows 62a-62c, each of which may hold one or more battery modules (and/or BBUs). In one embodiment, the BBU shelf may include more or less rows. In another embodiment, the rows may be partitioned, such that at least some battery modules are separate from other battery modules.

Figure 7:
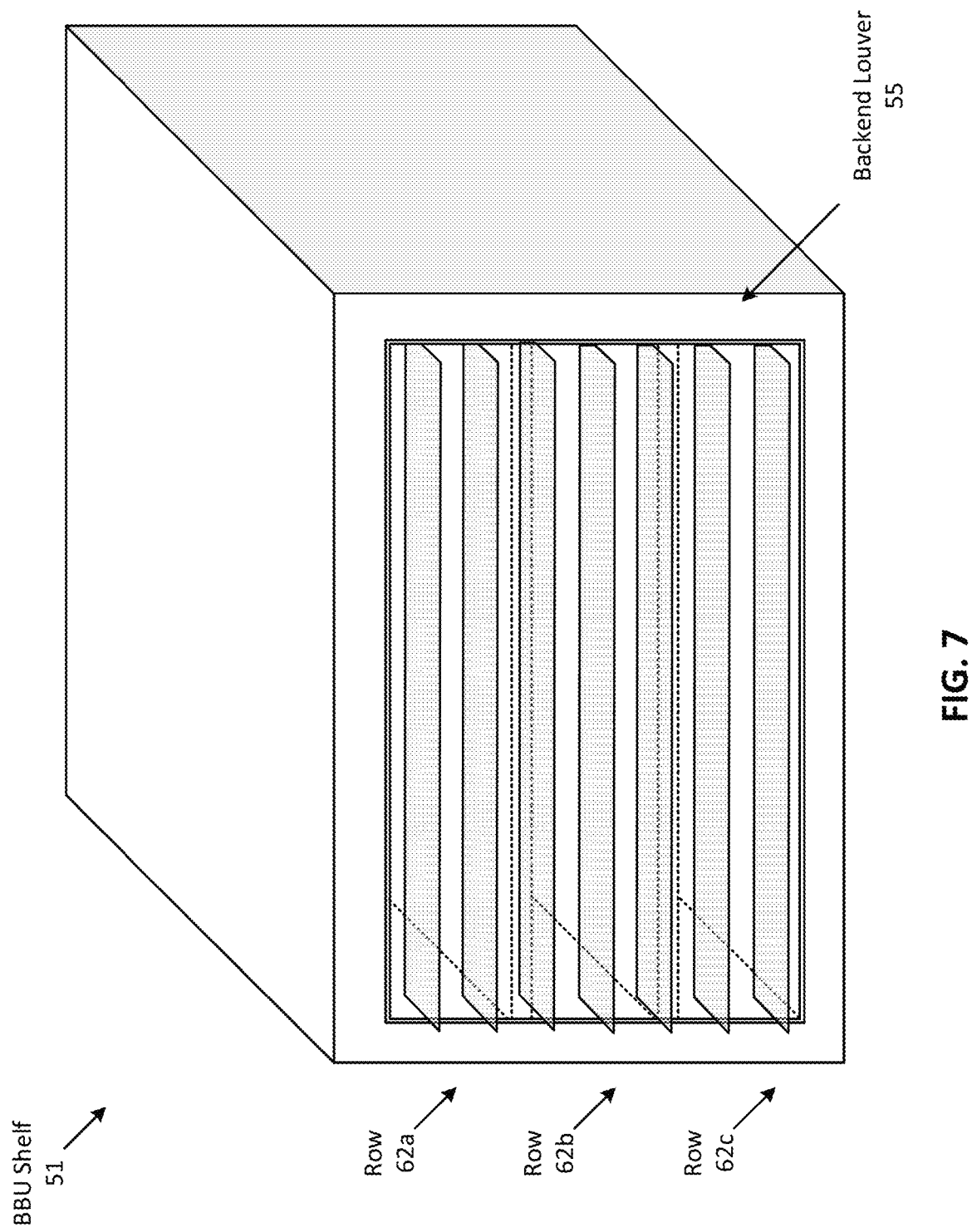
FIG. 7 is a perspective view of a BBU shelf with louvers according to one embodiment.

FIG. 7 is a perspective view of a BBU shelf with louvers according to one embodiment. Specifically, this figure illustrates a perspective view of BBU shelf 51 from a backend view. As shown, the backend louver 55 is open (e.g., the blades of the louver are rotated in order to allow air to flow into each of the BBU self's rows 62a-62c). In particular, the BBU shelf includes seven louver blades. In one embodiment, the shelf may include more or less blades. Although not illustrated, when the backend louver 55 is opened, the frontend louver 56 may also be opened. As described with reference to the BBU 1, the BBU shelf 51 may open and close the louvers based on the criteria mentioned herein (e.g., an internal temperature in excess of a temperature threshold).

In one embodiment, each row 62a-62c may include at least some of the components described herein. For instance, each row may have separate louvers that are operated by control mechanisms in each corresponding row. As a result, if a battery module within a particular row (e.g., 62a) leaks electrolytic fluid, a control mechanism for that row may close the row's louvers, while louvers for the other two rows, 62b and 62c, remain open. Thus, any leak (and/or fire) may be contained within a particular row, rather than having to close a louver that allows airflow through all of the rows. In one embodiment, each row 62a-62c may also include one or more fans 58. Thus, each row may have a separate fan. In another embodiment, however, one or more rows may share at least one fan between the rows.

Figure 8:
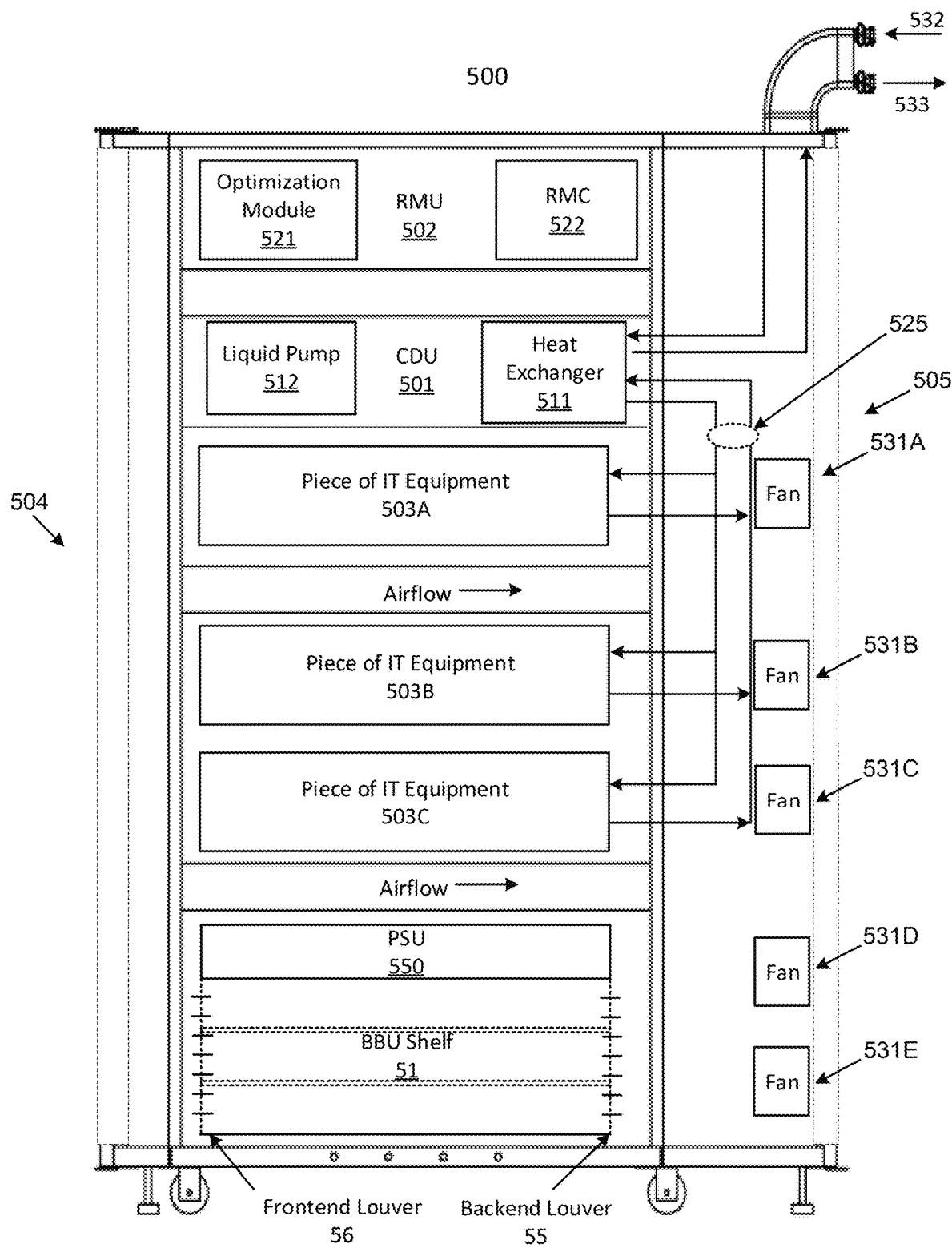
FIG. 8 is an example of an electronic rack with a BBU shelf according to one embodiment.

FIG. 8 is a block diagram illustrating an example of an electronic rack with BBU shelf 51 according to one embodiment. Specifically, rather than having BBU 1, as illustrated in FIG. 4, the rack 500 includes the BBU shelf that may include one or more battery modules (and/or separate BBUs). In one embodiment, the BBU shelf 51 is positioned at the bottom of the rack 500 in order to minimize chances of any pieces of IT equipment becoming contaminated if liquid leaks out of the shelf. Also illustrated, the louvers of the BBU shelf are open.

As previously explained, an embodiment of the disclosure may be (or include) a non-transitory machine-readable medium (such as microelectronic memory) having stored thereon instructions, which program one or more data processing components (generically referred to here as a "processor") to perform louver control operations, such as determining whether certain characteristics or criteria exist (e.g., whether an internal temperature is above a threshold) and in response controlling one or more louvers, as described herein. In other embodiments, some of these operations might be performed by specific hardware components that contain hardwired logic. Those operations might alternatively be performed by any combination of programmed data processing components and fixed hardwired circuit components.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

While certain aspects have been described and shown in the accompanying drawings, it is to be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some aspects, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some aspects, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. A battery backup unit (BBU) shelf, comprising:
a container that is arranged to be housed within an electronic rack that comprises a plurality of pieces of information technology (IT) equipment, the container having one or more rows, each row including;
 a battery module having one or more battery cells configured to provide battery energy to a load and configured to draw power from an external power supply to charge the battery cells, and
 a first louver at a frontend of the container and a second louver at a backend of the container, both louvers for controlling air flow through the row; and
a control mechanism that is coupled to the first and second louvers of each row and is configured to open and close louvers, wherein the battery module and the control mechanism are disposed within the container.

2. The BBU shelf of claim 1, further comprising a temperature sensor that is communicatively coupled to the control mechanism and is configured to sense an internal temperature of the BBU shelf, wherein the control mechanism is configured to close one or more louvers in response to the internal temperature exceeding a threshold temperature.

3. The BBU shelf of claim 1, further comprising a liquid detector that is communicatively coupled to the control mechanism and is configured to detect a presence of liquid in the container, wherein the control mechanism is configured to close one or more louvers in response to the liquid detector detecting the presence of liquid.

4. The BBU shelf of claim 1, wherein each louvers includes one or more blades that are configured to rotate between different positions in response to the control mechanism opening and closing the louver.

5. The BBU shelf of claim 4, wherein, while a louver is in a closed position, an edge of each blade of the louver abuts a different blade of the louver, wherein the edge of at least some of the blades are covered by a sealing material that is configured to form a seal between the edge and the different blade while abutting the different blade, the sealing material is composed of at least one of a rubber and a plastic.

6. The BBU shelf of claim 1, further comprising one or more fans that are coupled to the container and configured to push air through the container or draw air into the container while the first and second louvers of the one or more rows are open.

7. The BBU shelf of claim 1, further comprising a third louver that is disposed within the container and between the first and second louvers of a row, wherein the control mechanism is coupled to the third louver and is configured to open and close the third louver with the first and second louvers of the row.

8. The BBU shelf of claim 1, wherein the control mechanism is one of an actuator and a motor.

9. The BBU shelf of claim 8, wherein the actuator is a fail-close actuator that is configured to close the louvers in response to a failure of the actuator.

10. An electronic rack, comprising:
a plurality of pieces of Information Technology (IT) equipment, at least one of the pieces of IT equipment including one or more servers to provide data processing services;
a power supply unit coupled to the plurality of pieces of IT equipment; and
a battery backup unit (BBU) shelf to provide backup power to the pieces of IT equipment when the power supply unit is unavailable, wherein the BBU shelf including a container having one or more rows, each row having
one or more battery modules that each have one or more battery cells configured to provide battery energy to the pieces of IT equipment and configured to draw power from the power supply to charge the battery cells and
a first louver at a frontend of the container and a second louver at a backend of the container, both louvers for controlling air flow through the row, and
a control mechanism that is coupled to the first and second louvers of each row and is configured to open and close louvers,
wherein the one or more battery modules and the control mechanism are disposed within the container.

11. The electronic rack of claim 10, wherein the BBU shelf includes a temperature sensor is that communicatively coupled to the control mechanism and is configured to sense an internal temperature of the BBU shelf, wherein the control mechanism is configured to close one or more louvers in response to the internal temperature exceeding a threshold temperature.

12. The electronic rack of claim 10, wherein the BBU shelf includes a liquid detector that is communicatively coupled to the control mechanism and is configured to detect a presence of liquid in the container, wherein the control mechanism is configured to close one or more louvers in response to the liquid detector detecting the presence of liquid.

13. The electronic rack of claim 10, wherein each louvers includes one or more blades that are configured to rotate between different positions in response to the control mechanism opening and closing the louver.

14. The electronic rack of claim 13, wherein, while a louver is in a closed position, an edge of each blade of the louver abuts a different blade of the louver, wherein the edge of at least some of the blades are covered by a sealing material that is configured to form a seal between the edge and the different blade while abutting the different blade, the sealing material is composed of at least one of a rubber and a plastic.

15. The electronic rack of claim 10, further comprising one or more fans that are configured to push air through the container of the BBU shelf or draw air into the container of the BBU shelf while the first and second louvers of the one or more rows are open.

16. The electronic rack of claim 10, wherein the BBU shelf includes a third louver that is disposed within the container and between the first and second louvers of a row, wherein the control mechanism is coupled to the third louver and is configured to open and close the third louver with the first and second louvers of the row.

17. The electronic rack of claim 10, wherein the control mechanism is one of an actuator and a motor.

18. The electronic rack of claim 17, wherein the actuator is a fail-close actuator that is configured to close the louvers in response to a failure of the actuator.

19. The BBU shelf of claim 1, wherein the container is housed within the electronic rack such that the frontend of the container is facing a frontend of the electronic rack and the backend of the container is facing a backend of the electronic rack, wherein the frontend or the backend of the electronic rack is arranged to receive pieces of IT equipment that are housed within the electronic rack.

20. The electronic rack of claim 10, wherein the frontend of the container is facing a frontend of the electronic rack and the backend of the container is facing a backend of the electronic rack, wherein the frontend or the backend of the electronic rack is arranged to receive pieces of IT equipment.

\* \* \* \* \*